(12) United States Patent
Kwack et al.

(10) Patent No.: US 12,406,745 B2
(45) Date of Patent: Sep. 2, 2025

(54) MEMORY REPAIR DEVICE

(71) Applicant: Magnachip Semiconductor, Ltd., Cheongju-si (KR)

(72) Inventors: Jun Soo Kwack, Cheongju-si (KR); Yong Sup Lee, Cheongju-si (KR)

(73) Assignee: MAGNACHIP SEMICONDUCTOR, LTD., Cheongju-si (KR)

( * ) Notice: Subject to any disclaimer, the term of this patent is extended or adjusted under 35 U.S.C. 154(b) by 120 days.

(21) Appl. No.: 18/195,418

(22) Filed: May 10, 2023

(65) Prior Publication Data

US 2024/0136007 A1 Apr. 25, 2024
US 2024/0233853 A9 Jul. 11, 2024

(30) Foreign Application Priority Data

Oct. 21, 2022 (KR) .................. 10-2022-0136525

(51) Int. Cl.
*G11C 29/44* (2006.01)
*G11C 29/00* (2006.01)
*G11C 29/36* (2006.01)

(52) U.S. Cl.
CPC .......... *G11C 29/4401* (2013.01); *G11C 29/36* (2013.01); *G11C 29/789* (2013.01); *G11C 2029/3602* (2013.01)

(58) Field of Classification Search
CPC ... G11C 29/4401; G11C 29/36; G11C 29/789; G11C 2029/3602; G11C 29/76; G11C 2029/4402; G11C 29/18; G11C 29/24; G11C 29/808
See application file for complete search history.

(56) References Cited

U.S. PATENT DOCUMENTS

| | | | |
|---|---|---|---|
| 6,343,366 B1 * | 1/2002 | Okitaka | G11C 29/44 714/719 |
| 10,748,641 B2 | 8/2020 | Seok et al. | |
| 2006/0041799 A1 * | 2/2006 | Sato | G11C 29/56012 714/718 |
| 2014/0189450 A1 | 7/2014 | Varadarajan et al. | |
| 2019/0115091 A1 | 4/2019 | Seok et al. | |
| 2019/0385692 A1 * | 12/2019 | Nakaoka | G11C 29/38 |
| 2021/0166777 A1 * | 6/2021 | Shen | G11C 29/38 |
| 2022/0113889 A1 | 4/2022 | Park et al. | |

* cited by examiner

*Primary Examiner* — Jay W. Radke
(74) *Attorney, Agent, or Firm* — POLSINELLI PC (57) ABSTRACT

A memory repair device for detecting a fault cell in a memory and replacing it with a redundancy cell using a serial interface method is provided. The memory repair device include a repair information control block and at least one memory block including at least one memory. The repair information control block is configured to perform a built-in self-test (BIST) for each memory block, and when a fault cell is detected according to the BIST, receive and store repair information about the fault cell information. The memory block replaced the fault cell with a redundancy cell according to repair information loaded by the repair information control block at the time of operation of the memory. Data is transmitted and received between the repair information control block and the memory block using a serial interface.

19 Claims, 10 Drawing Sheets

MEMORY REPAIR DEVICE

CROSS-REFERENCE TO RELATED APPLICATION

This application claims the benefit under 35 U.S.C. § 119 of Korean Patent Application No. 10-2022-0136525 filed on Oct. 21, 2022, in the Korean Intellectual Property Office, the entire disclosure of which is incorporated herein by reference for all purposes.

BACKGROUND

1. Field

The present description relates to a memory repair device for detecting a fault cell in a memory using a serial interface method and replacing it with a redundancy cell.

2. Description of Related Art

Recently, the degree of integration of circuits on a single chip is rapidly increasing due to the development of design and process technologies along with demands for high performance, high functionality, and miniaturization of the system. Therefore, it may be necessary to integrate more devices in a limited area, and in particular, to further improve the function of a chip, an integrated circuit such as a System-On-Chip (SOC) is designed to be equipped with multiple memories.

Yield improvement of an integrated circuit may vary depending on how effectively a memory is repaired. A method of repairing a memory detects a fault cell and replaces the fault cell with a redundancy cell such that the memory and the integrated circuit including the same operate normally. When the memory is repaired, it may be possible to continuously use the memory having the fault cell as well as the integrated circuit equipped with the memory without discarding it as a defective product.

In this way, detecting and replacing a fault cell with a redundancy cell to ensure normal operation of the memory may be an important factor in improving the yield and quality of an integrated circuit designing and manufacturing an integrated circuit having a memory.

SUMMARY

This Summary is provided to introduce a selection of concepts in a simplified form that are further described below in the Detailed Description. This Summary is neither intended to identify key features or essential features of the claimed subject matter, nor is it intended to be used as an aid in determining the scope of the claimed subject matter.

In a general aspect, a memory repair device including: a repair information control block and a memory block with at least one memory. The repair information control block controls a Built-in Self-Test (BIST) to be performed for each memory block, and if a fault cell is confirmed as a result of the BIST, the repair information control block receives and stores repair information related to the fault cell in a repair information storage block. The memory block performs memory repair by replacing the fault cell with a redundancy cell according to repair information loaded by the repair information control block at the time of operation of the memory.

Data between the repair information control block and the memory block may be transmitted and received in a serial interface method through an interface conversion circuit.

The repair information control block may include: a BIST control circuit for generating a fault cell detection command for BIST of the memory block; a first interface conversion circuit for converting the fault cell detection command into serial data; and a repair information alignment circuit for aligning repair information transmitted from the memory block such that the repair information is stored in a predetermined location of the repair information storage block.

The memory block may include: a second interface conversion circuit for generating a BIST start flag when the serial data is converted into a fault cell detection command; a BIST circuit for testing whether there is a fault cell in a memory according to the fault cell detection command; and a Built-in Redundancy Analysis (BIRA) circuit for detecting and transmitting, if there is a fault cell as a result of the test, repair information related to the fault cell to the repair information control block.

The repair information may include address information of the fault cell and index information indicating the memory block where the fault cell is located.

The BIST circuit may include: a pattern generation circuit for generating pattern information suitable for a size of the memory and storing data and addresses in the memory; and a pattern confirmation circuit for confirming whether there is a fault cell based on pattern information of the data provided by the memory.

The pattern generation circuit may generate the pattern information if the BIST start flag is received from the second interface conversion circuit.

The BIRA circuit may include: a fault cell address detection circuit for detecting a fault cell address; and a fault cell address conversion circuit for receiving a user address and remapping a fault cell address to a redundancy cell address to be transmitted to the memory when repair process is performed by the repair information control block.

The repair information storage block may be located inside the memory block or outside the memory block.

The interface conversion circuit may include a first interface conversion circuit and a second interface conversion circuit for transmitting serial data between the repair information control block and the memory block. The first interface conversion circuit may transmit serial data by a clock signal generated by a clock generation unit. The second interface conversion circuit may transmit serial data by a clock signal provided by the clock generation unit of the first interface conversion circuit.

In another general aspect, a memory repair device includes: a repair information control block; and memory blocks connected to the repair information control block through a serial interface. The repair information control block loads previously stored repair information to transmit the loaded repair information to the corresponding memory block. The memory block remaps a fault cell address to a redundancy cell address based on the repair information to repair a memory.

The repair information control block may access to only memory blocks need repair such that a memory repair is performed.

The memory block may perform a repair process if repair information loaded by the repair information control block is transmitted at a time of operation of the memory.

The repair information control block may load the previously stored repair information from a repair information storage block.

The repair information storage block may be located inside the memory block or outside the memory block.

In another general aspect, a memory repair device includes: memory blocks; and a memory control unit for performing grouping with memory blocks based on a same size of memory cells. The memory block includes: memory devices having memory cells of a same size; a single BIST circuit for detecting a fault cell of the memory devices; BIRA circuits provided in each of the memory devices; and a serial interface circuit for serial communication with the memory control unit.

The memory control unit may perform a Built-in Self-Test (BIST) on memory devices of various sizes provided in each of the memory blocks at one time and repairs a memory device with a fault cell.

The memory control unit may generate pattern information and address corresponding to a size of a memory cell.

The memory control unit, during a period in which a BIST function of a memory block with memory cells of a relatively large size is performed, may turn off a BIST function of a memory block having memory cells of a relatively small size so that a clock signal is not generated.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section.

The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terms indicating a part such as "part" or portion" used herein to mean that the component may represent a device that may include a specific function, a software that may include a specific function, or a combination of device and software that may include a specific function, but it is not necessarily limited to the function expressed. This is only provided to help a more general understanding of one or more examples herein, and various modifications and variations are possible from these descriptions by those of ordinary skill in the art to which the one or more examples pertains.

In addition, it should be noted that all electrical signals used herein are examples, and when an inverter or the like is additionally provided in the circuit in accordance with one or more embodiments, the signs of all electrical signals to be described below may be reversed. Accordingly, the scope of the embodiments is not limited to the direction or polarity of the signal.

The features of the examples described herein may be combined in various ways as will be apparent after an understanding of the disclosure of this application. Further, although the examples described herein have a variety of configurations, other configurations are possible as will be apparent after an understanding of the disclosure of this application.

A detailed description is given below, with attached drawings. The features of the examples described herein may be combined in various ways as will be apparent after an understanding of the disclosure of this application. Further, although the examples described herein have a variety of configurations, other configurations are possible as will be apparent after an understanding of the disclosure of this application.

In some aspects, the detecting and repairing a fault cell may be required to improve the quality of the memory. In general, Built-in Self-Test (BIST) is configured to detect and repair a fault cell, and a BIST will first be described with reference to a repair method according to the conventional art.

The present description is provided to suggest a memory repair device that may improve the yield and quality of integrated circuits.

The present description is provided also to suggest a memory repair device in which the number of routers for transmitting repair information is reduced as compared to the conventional art.

Figure 1:
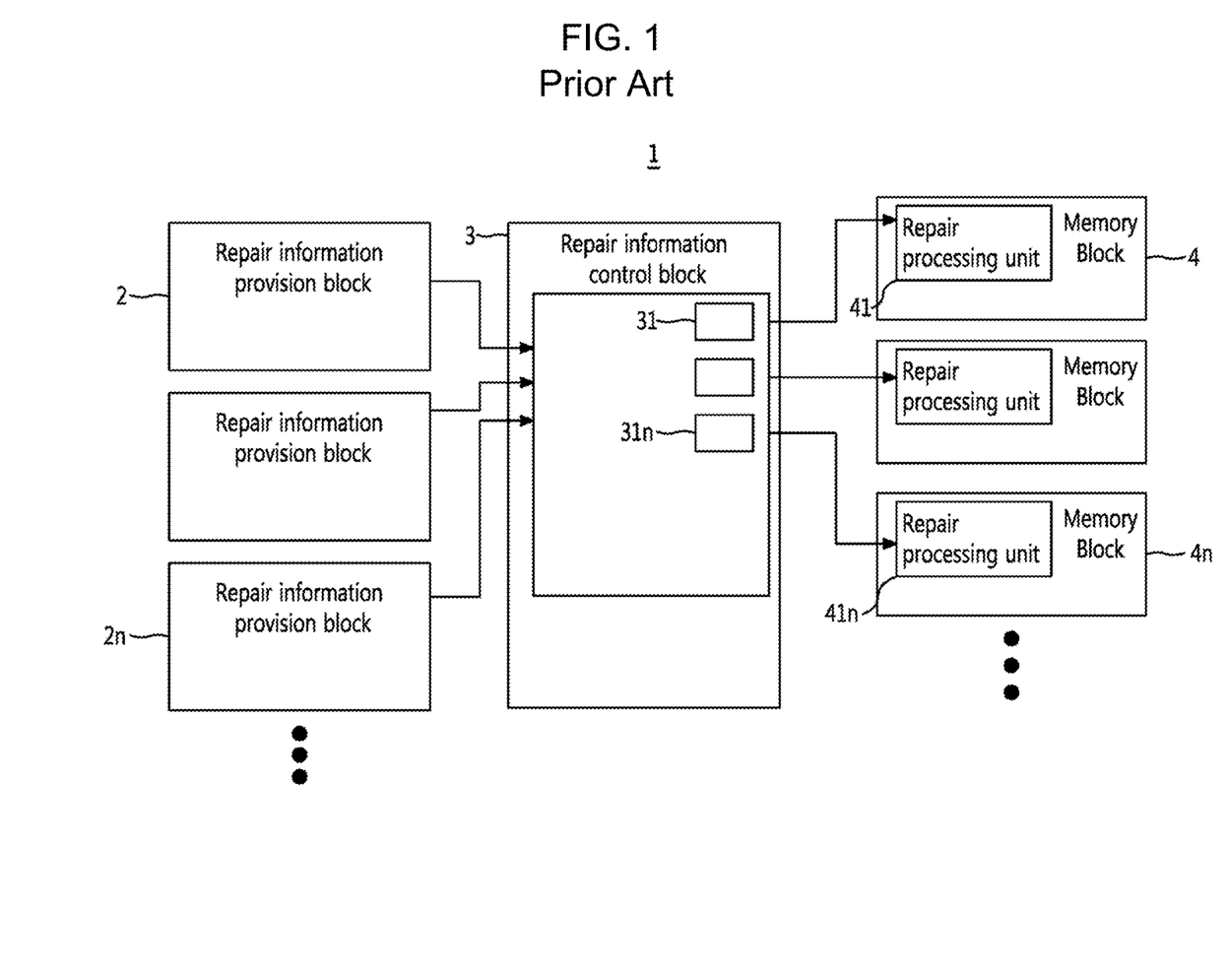
FIG. 1 illustrates a block diagram of a memory repair device according to the conventional art.

FIG. 1 illustrates a block diagram of a memory repair device according to the conventional art.

Referring to FIG. 1, a memory repair device 1 includes a repair information provision blocks 2-2n, a repair information control block 3, and memory blocks 4-4n.

The repair information provision blocks 2-2n may include a BIST circuit for obtaining repair information related to a fault cell of a memory. The repair information includes address information of the fault cell to be replaced with a redundancy cell and an index indicating a memory block.

The repair information control block 3 includes repair information storage units 31-31n that store repair information transmitted by the repair information provision block 2 and loads the repair information stored in the repair information storage units 31-31n during initial operation of the memory and then performs the function of transmitting repair information to a memory block 4. The repair information storage units 31-31n may include flash memories or one-time programmable (OTP) memories.

The memory blocks 4-4n may include repair processing units 41-41n that replace a fault cell with a redundancy cell using repair information transmitted by the repair information control block 3. In some aspects, the repair processing units 41-41n perform a repair process overall.

However, as illustrated, the repair information is transmitted between the repair information control block 3 and memory blocks 4-4n in parallel of a pin-to-pin structure. In some cases, when a chip is designed to increase the number of memory blocks 4-4n and the size of a memory, the number of routings required for information transmission (e.g., electrical conductors) to be transmitted increases accordingly. For example, in the case of an integrated circuit with 10 memories, 4 redundancy cells, and 10 bits of repair address, if repair is performed using the pin-to-pin method, this was possible with approximately 800 routings. When repair information is transmitted in parallel, it is difficult to perform repair and not easy to apply in practice.

Figure 2:
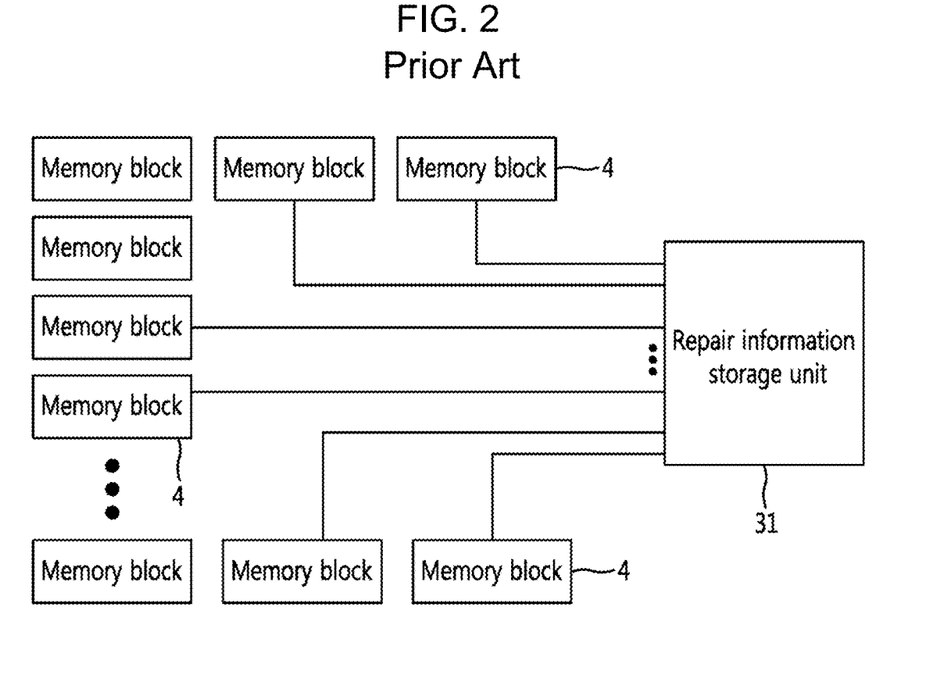
FIG. 2 illustrates an example diagram in which memory blocks access to a repair information storage unit to store repair information in a memory repair device according to the conventional art.

FIG. 2 illustrates a diagram in which memory blocks access a repair information storage unit to store repair information in a memory repair device according to the conventional art.

As illustrated in FIG. 2, repair information that is generated in each memory is stored in one repair information storage unit 31. Thus, when memory repair is performed, a plurality of memory blocks 4 simultaneously access to the repair information storage unit 31 storing repair information. Congestion issue may occur and may cause repair information to be transmitted incorrectly.

In this way, in the repair device according to the conventional art, since the repair information is transmitted in parallel through a transmission path connected by a pin-to-pin type hard wire, the number of routings cannot be reduced and there high possibility of errors in transmission of the repair information due to congestion.

In some aspects, a serial interface may prevent congestion issues and improve operation of the memory repair device. When using the serial interface, the number of routings may be reduced and the congestion issue may be also solved.

Figure 3:
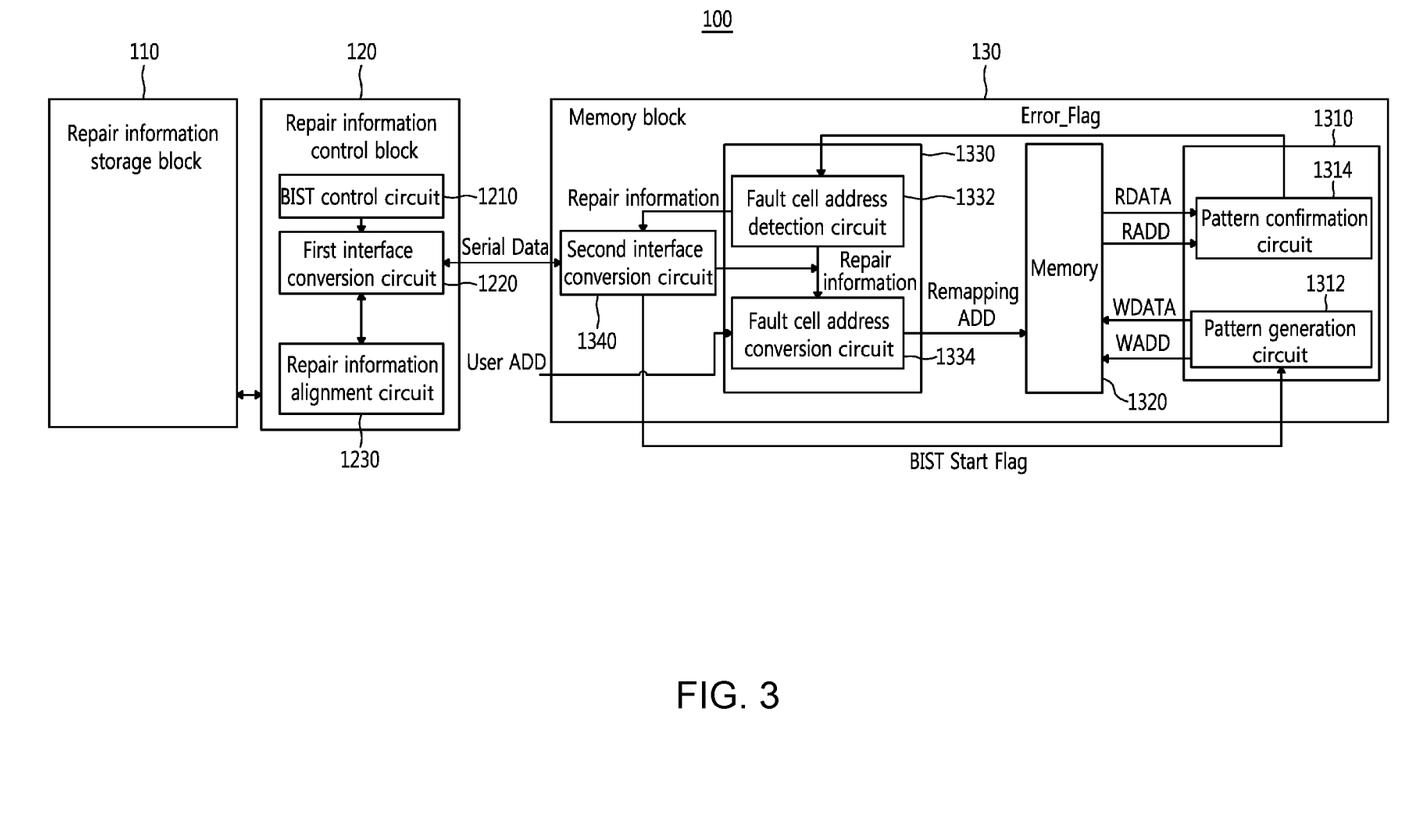
FIG. 3 illustrates a block diagram of a memory repair device according to various aspects of the present disclosure.

FIG. 3 illustrates a block diagram of a memory repair device according to various aspects of the present disclosure.

A memory repair device 100 in FIG. 3 according to a first aspect of the present disclosure includes a repair information storage block 110, a repair information control block 120, and a memory block 130. The blocks 110, 120, 130 communicate with each other through a serial interface.

The repair information control block 120 performs a BIST on the memory block 130 and controls the repair process when there is a memory to be repaired.

In one illustrative aspect, the repair information control block 120 is configured to include a BIST control circuit 1210 that generates a fault cell detection command for BIST in the memory block 130, a first interface conversion circuit 1220 that encodes and converts the fault cell detection command into serial data to be transmitted to the memory block 130, and a repair information alignment circuit 1230 that aligns repair information transmitted from the memory block 130 to be stored in a corresponding storage location of the repair information storage block 110.

The memory block 130 performs a BIST according to the control operation of the repair information control block 120 and transmits the result of the performance to the repair information control block 120. The memory block 130 may be configured to include a second interface conversion circuit 1340, a memory 1320, a BIST circuit 1310, a Built-in Redundancy Analysis (BIRA) circuit 1330, etc.

The second interface conversion circuit 1340 decodes serial data transmitted by the first interface conversion circuit 1220 and converts the serial data back into a fault cell detection command. At this time, the second interface conversion circuit 1340 transmits a BIST start flag to a pattern generation circuit 1312 of the BIST circuit 1310.

The BIST circuit 1310 includes a pattern generation circuit 1312 and a pattern confirmation circuit 1314 and tests whether there is a fault cell in a memory based on the fault cell detection command. After receiving the BIST start flag, the pattern generation circuit 1312 generates patterns suitable for the size of the memory (e.g., various combinations of binary numbers using algorithms such as modified algorithmic test sequence++(MATS++) and March C−) and inputs data and addresses corresponding to the patterns into the memory 1320. The pattern confirmation circuit 1314 confirms whether there is a fault cell based on a pattern of data output by the memory 1320.

The BIRA circuit 1330 includes a fault cell address detection circuit 1332 and a fault cell address conversion circuit 1334. The fault cell address detection circuit 1332 detects a fault cell based on an Error_Flag transmitted by the pattern confirmation circuit 1314 and transmits information related to the detected fault cell to the second interface conversion circuit 1340 and the fault cell address conversion circuit 1334. Herein, the information related to the detected fault cell becomes repair information. The repair information includes address information that identifies a fault cell and index information indicating a memory block in which the fault cell is located. In addition, the repair information may include Bit Fail information including bit information related to a fault cell. The fault cell address conversion circuit 1334 receives a user address(User ADD), remaps a fault cell address to a redundancy cell address, and transmit the remapped the redundancy cell address to the memory.

The repair information storage block 110 stores repair information transmitted by the repair information alignment circuit 1230.

Figure 4:
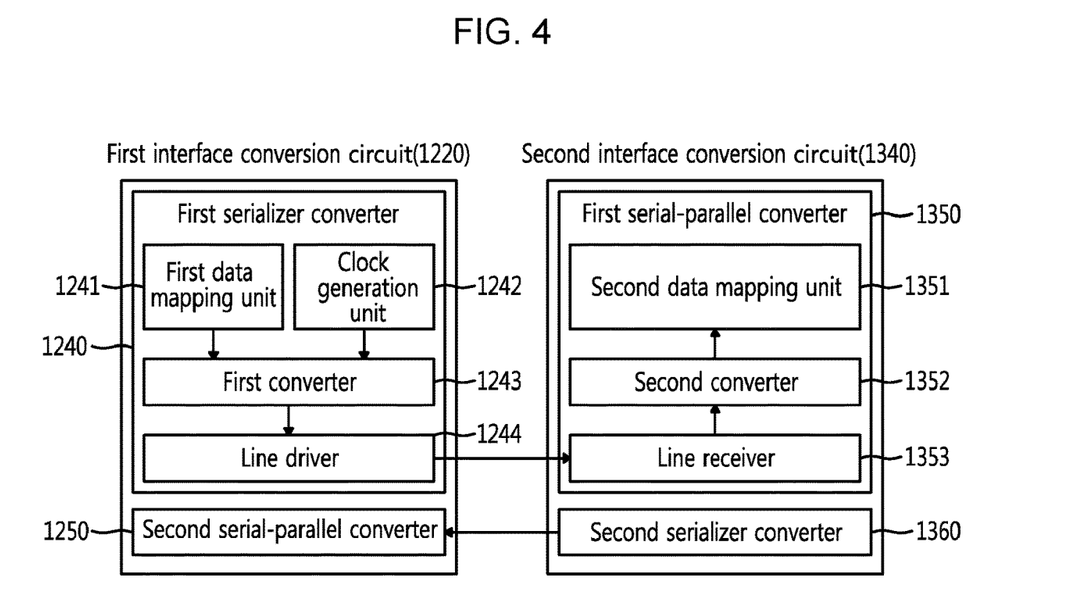
FIG. 4 illustrates an internal block diagram of the first interface conversion circuit and the second interface conversion circuit of FIG. 3 according to various aspects of the present disclosure.

FIG. 4 illustrates an internal block diagram of the first interface conversion circuit and the second interface conversion circuit of FIG. 3 according to various aspects of the present disclosure.

As illustrated in FIG. 4, a first interface conversion circuit 1220 includes a first serializer converter 1240 and a second serial-parallel converter 1250, and a second interface conversion circuit 1340 includes a first serial-parallel converter 1350 and a second serializer converter 1360. Herein, since the first serializer converter 1240 and the second serializer converter 1360 have a similar configuration and the first serial-parallel converter 1350 and the second serial-parallel converter 1250 have a similar configuration, the configuration of one serializer converter and one serial-parallel converter will be described.

The first serializer converter 1240 includes a first data mapping unit 1241, a clock generation unit 1242, a first converter 1243, and a line driver 1244. The first data mapping unit 1241 maps a fault cell detection command for starting BIST, the first converter 1243 converts the fault cell detection command into serial data, and the line driver 1244 transmits the transmitted serial data. The transmission of serial data is performed according to a clock signal generated by the clock generation unit 1242.

The first serial-parallel converter 1350 includes a second data mapping unit 1351, a second converter 1352, and a line receiver 1353. The line receiver 1353 communicates with the line driver 1244 of the first serializer converter 1240 to receive serial data, the second converter 1352 converts the serial data into a fault cell detection command, and the second data mapping unit 1351 transmits the fault cell detection command to each memory.

The first serializer converter 1240 of the first interface conversion circuit 1220 is included the clock generation unit 1242 while the second serializer converter 1360 of the second interface conversion circuit 1340 is not included a clock generation unit. This is because the second serializer converter 1360 transmits serial data according to a clock signal generated by the clock generation unit 1242 of the first serializer converter 1240.

A repair method of the memory repair device according to one example of the present disclosure is as follows.

In some aspects, the repair method begins by detecting a fault cell by performing BIST tests on a plurality of memory blocks 130.

In some cases, to detect a fault cell, a BIST control circuit 1210 of the repair information control block 120 generates a fault cell detection command to perform a BIST on each memory 1320 provided in each memory block 130.

A fault cell detection command generated by the BIST control circuit 1210 is transmitted to each memory block 130. At this time, the fault cell detection command is transmitted through a serial interface designed to reduce the number of routings as compared to a parallel method. In detail, the first interface conversion circuit 1220 converts a fault cell detection command into serial data and transmits the serial data to the second interface conversion circuit 1340 provided in each memory block 130. Then, the second interface conversion circuit 1340 decodes the serial data and converts the serial data into a fault cell detection command to test whether there is a fault cell in each memory 1320.

When the second interface conversion circuit 1340 converts serial data into a fault cell detection command, a BIST start flag information is generated, and the BIST start flag is transmitted to a pattern generation circuit 1312. Then, the pattern generation circuit 1312 generates pattern information suitable for each memory size, such as MATS++, March C−, and inputs data and addresses corresponding to the pattern information into the memory 1320. After that, a pattern confirmation circuit 1314 confirms whether data RDATA outputted from the memory 1320 is identical to the inputted data WDATA. The pattern confirmation circuit 1314 detects whether there is a fault cell in the memory 1320 based on differences in the inputted data WDATA and the data RDATA read from the memory 1320.

As a result of the confirmation by the pattern confirmation circuit 1314, if there is no fault cell, no information is generated and tests are repeatedly performed. In some case, if there is a fault cell at an address in the memory 1320, the pattern confirmation circuit 1314 transmits Error_Flag information including address information to a fault cell address detection circuit 1332 of a BIRA circuit 1330.

The fault cell address detection circuit 1332 receives the Error_Flag, confirms that there is a fault cell in the corresponding memory 1320, and detects repair information based on the Error_Flag. As described above, repair information includes repair address information and an index indicating a memory block. The detected repair information is transmitted to the second interface conversion circuit 1340 and a fault cell address conversion circuit 1334. Then, the second interface conversion circuit 1340 converts the repair information into serial data and transmits the data (e.g., serialized repair information) to the first interface conversion circuit 1220, and the first interface conversion circuit 1220 decodes and transmits the serial data to a repair information alignment circuit 1230. The repair information alignment circuit 1230 stores the decoded repair information in a predetermined location of the repair information storage block 110. The repair information transmitted to the fault cell address conversion circuit 1334 is used when the fault cell is replaced with a redundancy cell by receiving a user address(User ADD) at the time when the memory 1320 operates.

Through this process, a repair information control block 120 performs a test for each memory block 130, and, if there is a fault cell, repair information transmitted by a corresponding memory block may be stored in a repair information storage block 110. Therefore, a plurality of repair information is stored in the repair information storage block 110.

Aspects of a repair process using the repair information stored in the repair information storage block 110 will be described next.

The repair process of replacing a fault cell with a redundancy cell uses repair information loaded by the repair information control block 120. At this time, the repair information control block 120 knows a memory block with a fault cell and a fault cell address information of the corresponding memory. According to the conventional art, when a memory block is reset after operation of detecting a fault cell, operation of finding an address information of the fault cell again. On the contrary, the repair information control block 120 according to the present disclosure does not require operation of finding the address information of the fault cell to be repaired. In one aspect, the repair information control block 120 recognizes the address information of a memory to be repaired even though the memory block is reset after the operation of detecting the fault cell.

The repair process for a fault cell starts with loading repair information from the repair information storage block 110 by the repair information control block 120 at the time when the memory operates. At this time, when repair information is loaded, the repair information stored in the repair information storage block 110 is sequentially loaded and thus memory blocks with fault cell information are sequentially accessed.

The repair information loaded by the repair information control block 120 is transmitted to a corresponding memory block through the first interface conversion circuit 1220 and the second interface conversion circuit 1340. In some cases, to repair the fault cell, the memory block 130 remaps a fault cell address to a redundancy cell address based on the repair information and the user address(User ADD).

In this way, according to examples of the present disclosure, repair may be performed by loading only repair information stored in the repair information storage block 110 and transmitting it to the memory 1320.

Figure 5:
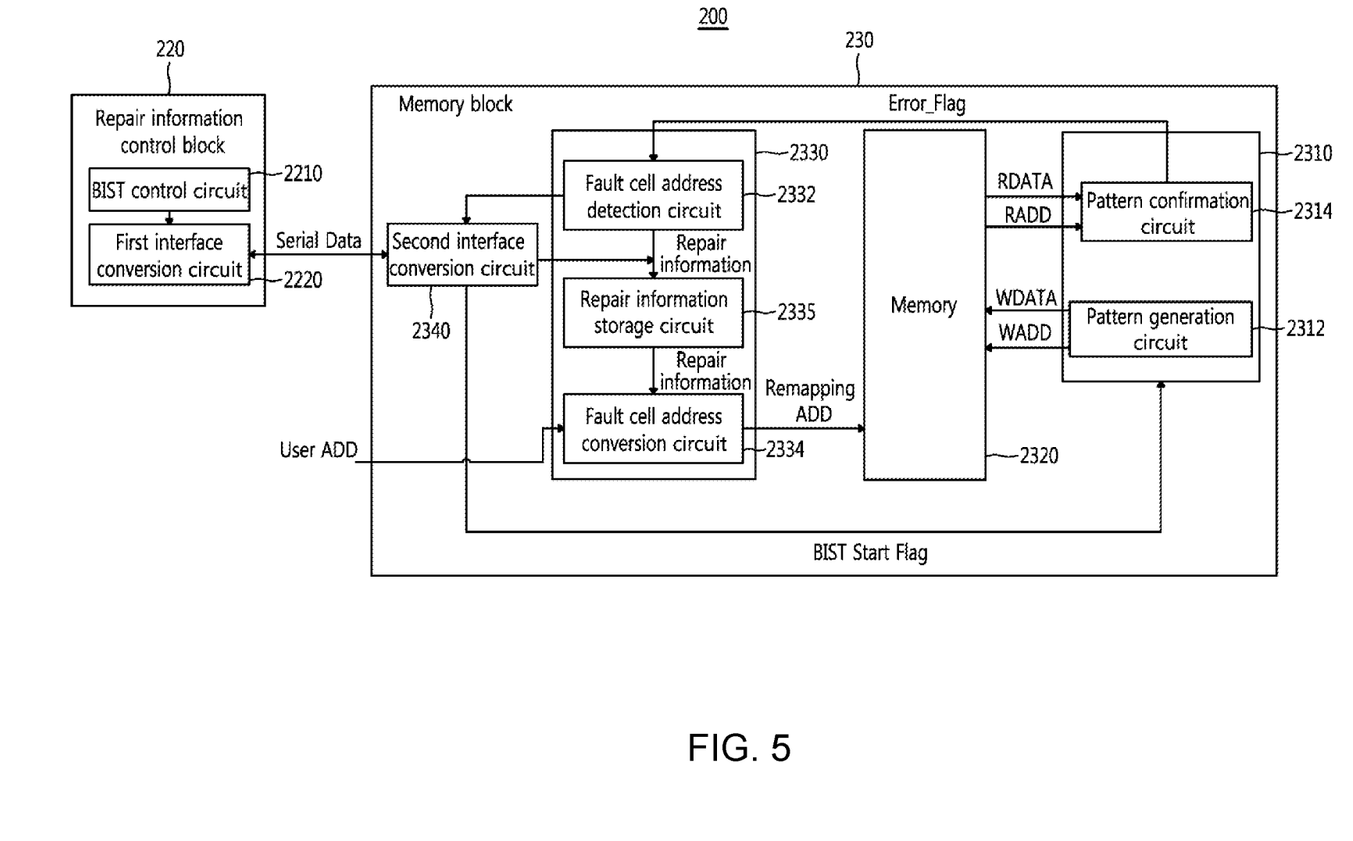
FIG. 5 illustrates a block diagram of a memory repair device according to a various aspects of the present disclosure.

FIG. 5 illustrates a block diagram of a memory repair device 200 according to various aspects of the present disclosure.

Comparing the configuration according to the aspect in FIG. 5 with the configuration of FIG. 3 according to the first example, there may be some differences when it comes to the configuration in which a repair information storage circuit 2335 is provided inside a BIRA circuit 2330 and the configuration in which a repair information alignment circuit is removed from a repair information control block 220. All other configurations are the same as those of the example of FIG. 3. Accordingly, description of other configurations will be omitted.

The repair process according to the aspect illustrated in FIG. 5 is as follows.

First, a fault cell is detected. For example, to detect a fault cell, a BIST control circuit 2210 of the repair information control block 220 generates a fault cell detection command to perform a BIST on a memory 2320 provided in each memory block 230.

The fault cell detection command generated by the BIST control circuit 2210 is encoded into serial data through a first interface conversion circuit 2220 and serially transmitted to a second interface conversion circuit 2340 of each memory block 230.

Each memory block 230 receives the serial data (e.g., encoded fault cell detection command), decodes the serial data into the fault cell detection command using the second interface conversion circuit 2340, and determines whether there is a fault cell in each memory 2320 according to the decoded fault cell detection command.

The test process is performed in the similar way as described above with reference to FIG. 3. For example, when a pattern generation circuit 2312 receives a BIST start flag, the pattern generation circuit 2312 generates patterns, such as MATS++, March C−, suitable for the size of a memory and inputs data and addresses into the memory 2320. A pattern confirmation circuit 2314 confirms whether the pattern is correctly generated based on the pattern information provided from the memory 2320. Then pattern confirmation circuit 2314 determines whether there is a fault cell in the memory 2320.

As a result of confirmation of the pattern confirmation circuit 2314, if there is no fault cell, no information is generated. In some cases, if there a fault cell in an address of the memory 2320, the pattern confirmation circuit 2314 transmits an Error_Flag information including an address information to a fault cell address detection circuit 2332 of the BIRA circuit 2330. Then, the fault cell address detection circuit 2332 confirms that there is a fault cell in the memory 2320 and detects repair information based on the Error_Flag information. The detected repair information is transmitted to the repair information control block 220 through the second interface conversion circuit 2340 and the first interface conversion circuit 2220 and is also transmitted and stored in the repair information storage circuit 2335.

In such state, when the memory 2320 operates, the repair information control block 220 loads the repair information from the repair information storage circuit 2335 provided in the memory block 230. A repair is performed when the fault cell address conversion circuit 2334 remaps a fault cell address to a redundancy cell address based on the loaded repair information and the user address(User ADD).

In some aspects, the repair information control block 220 sequentially accesses only memory blocks to be repaired such that the repair is performed.

Figure 6:
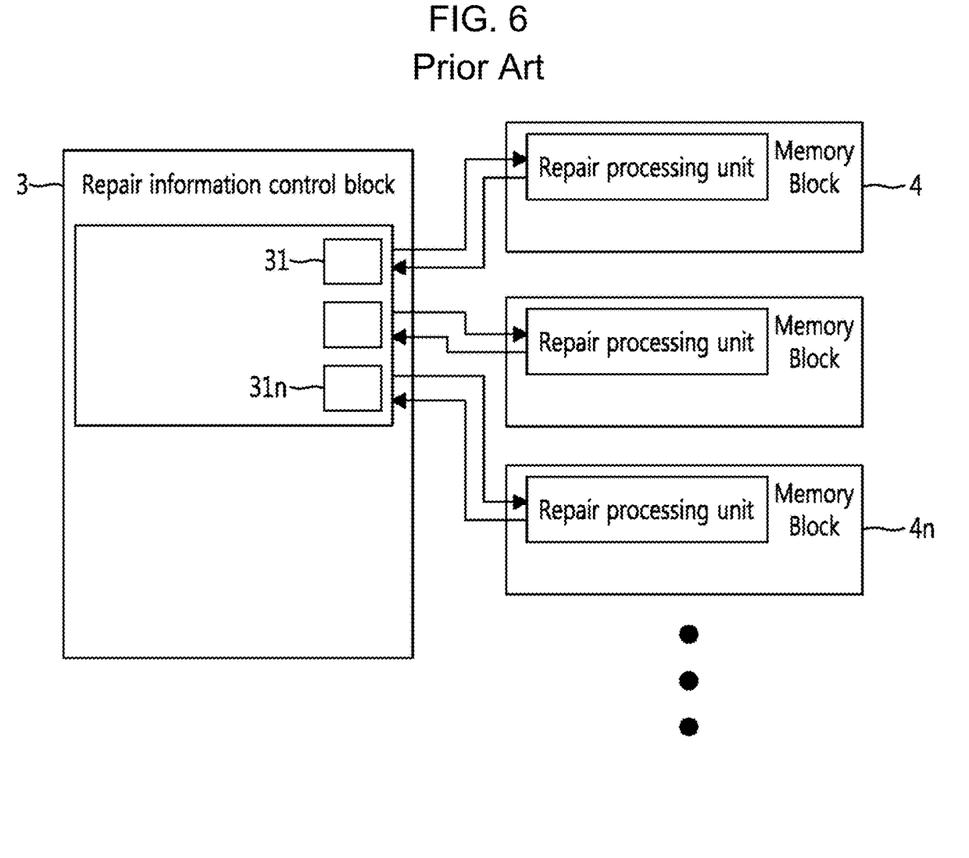
FIGS. 6 and 7 illustrate diagrams for comparison between a repair processing method according to the conventional art and a repair processing method according to various aspects of the present disclosure.
Figure 7:
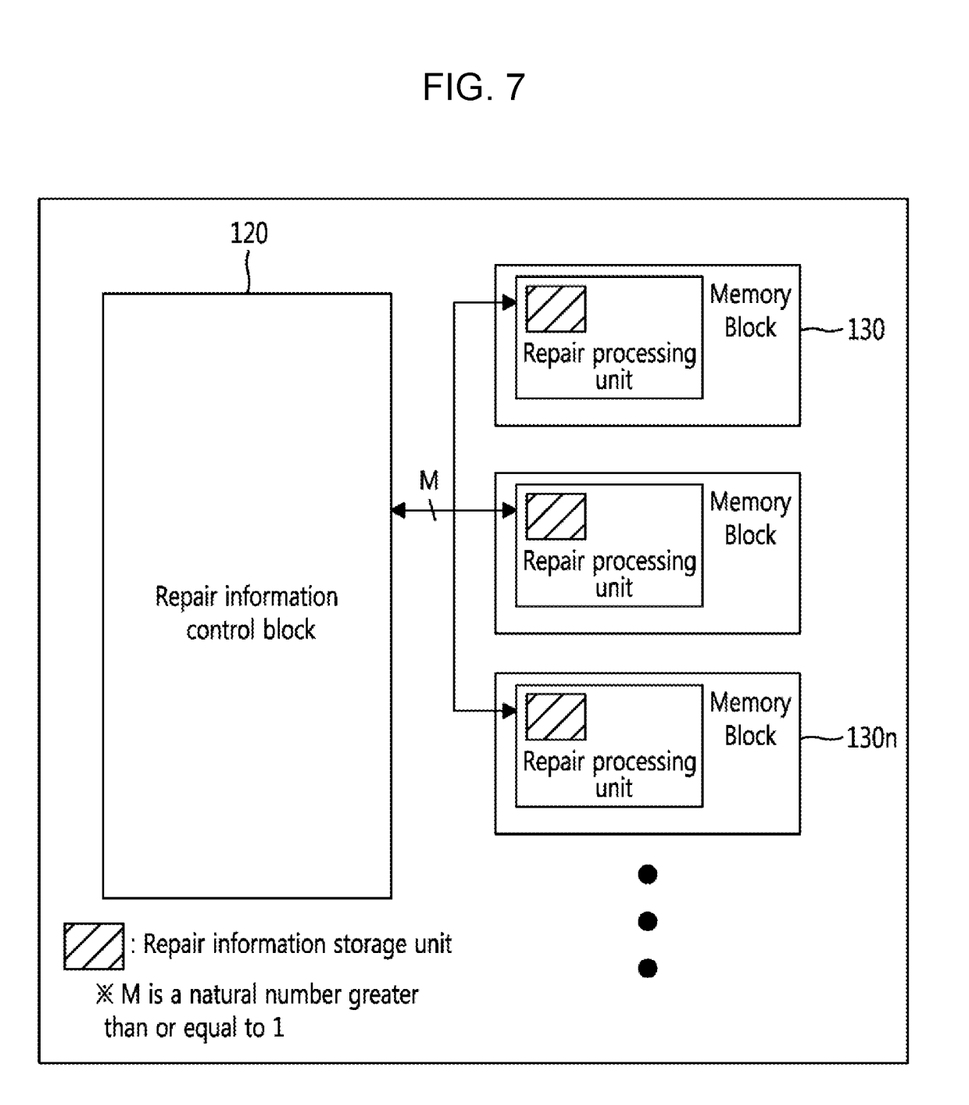

FIGS. 6 and 7 illustrate diagrams for comparison between a repair processing method according to the conventional art and a repair processing method according to various aspects of the present disclosure.

FIG. 6 illustrates a repair processing method according to a conventional structure, and it may be seen that a repair information control block 3 and each of memory blocks 4-4n are connected in parallel of a Pin-to-Pin structure. In other words, the number of routings is equal to the number of the memory blocks 4-4n. Thus, when a chip design is requested to increase the number and size of memories, the amount of information to be transmitted increases and the number of routings inevitably increases. An increase in the number of routings may limit reducing the design area of an integrated circuit.

In addition, in the conventional structure, since a plurality of memory blocks 4-4n simultaneously access the repair information control block 3, the design of the integrated circuit must also account for congestion issues.

FIG. 7 illustrates a diagram of a repair processing method according to the present disclosure, and one repair information control block 120 and a plurality of memory blocks 130-130n are connected through a serial interface to perform repair. As compared to FIG. 6, the number of routings may be significantly reduced, so congestion issue may be fundamentally prevented and increase space for layout of various components on the integrated circuit.

Figure 8A:
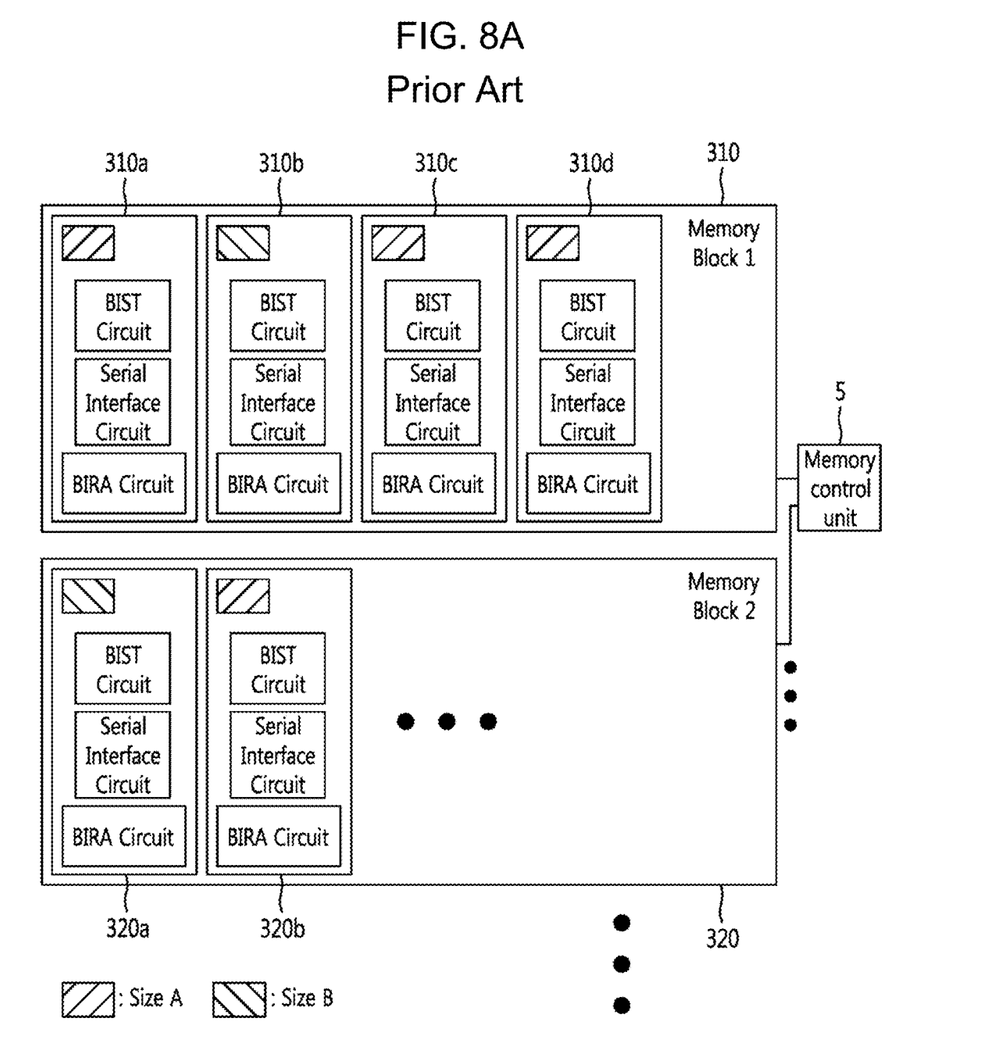
FIG. 8A illustrates a diagram of a state before grouping memory cells of different sizes in a memory repair device according to the conventional art.

FIG. 8A illustrates a diagram of a state before grouping memory cells of different sizes in a memory repair device according to the conventional art.

When detecting and repairing a fault cell in a memory block having memory cells of the same size in an integrated circuit, one BIST circuit and the same number of BIRA circuits as the number of memory cells are required. However, when there are memory cells having different sizes in one memory block, multiple BIST circuits may be included in the integrated circuit because the pattern lengths and address lengths of the memory cells are different from each other.

As illustrated in FIG. 8A, when each of memory blocks 310, 320 has memory cells of different sizes, a single BIST circuit is unable detect and repair fault cells of the memory cells. For example, as described above, pattern lengths and the number of addresses of memory cells are different.

In detail, referring to the memory block 310 of FIG. 8A, the sizes of memory cells included in memory devices 310a, 310c, 310d are different from the size of memory cell included in the memory device 310b. Also, the sizes of memory cells included inside the memory devices 320a, 320*b* are different from each other. When the memory block is configured in this way, it is not easy for a single BIST circuit to detect and repair fault cells of memory cells. Therefore, as illustrated in FIG. 8A, a BIST circuit and a serial interface circuit are required for each memory device.

Figure 8B:
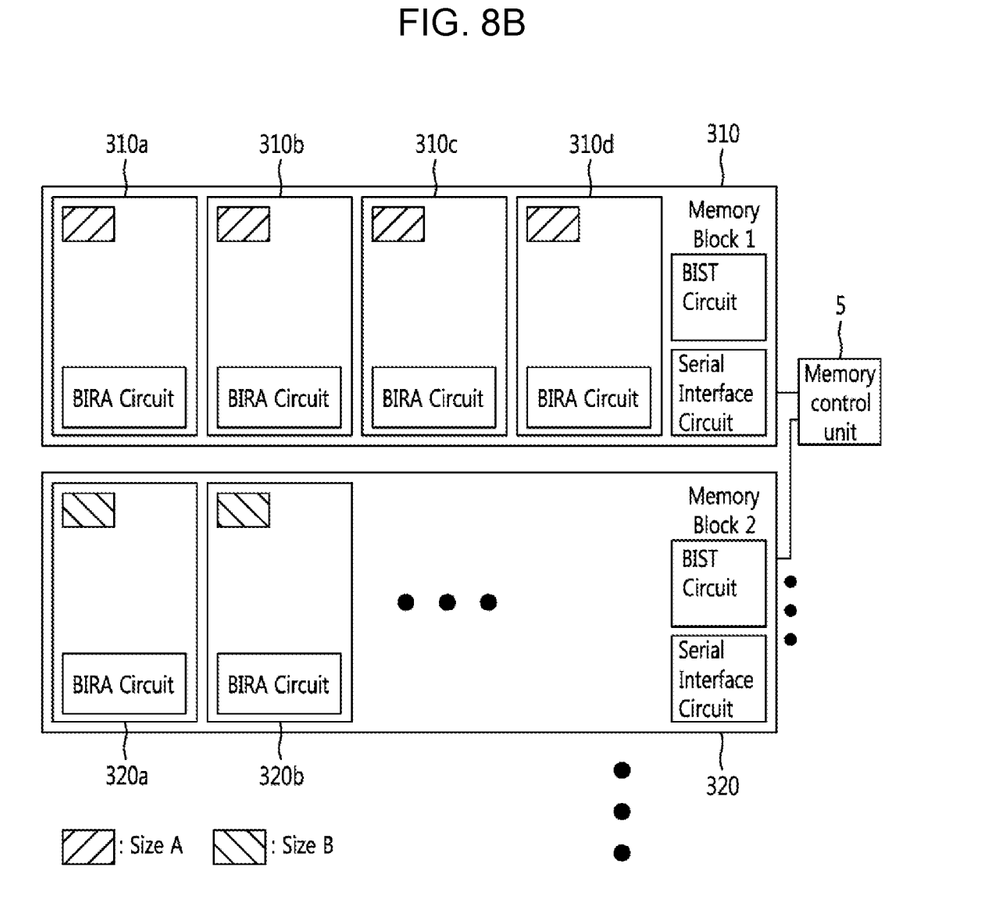
FIG. 8B illustrates a block diagram of memory cells grouped by same size in a memory repair device according to various aspects of the present disclosure.

FIG. 8B illustrates a block diagram of memory cells grouped by same size in a memory repair device according to various aspects of of the present disclosure. According to examples of the present disclosure, when a memory block has memory cells of different sizes, memory cells of the same size may be grouped into a memory block to detect and repair a fault cell.

FIG. 8B illustrates a state in which a memory control unit 5 inspects the sizes of memory cells and grouping memory devices with memory cells of the same size into a first memory block 310 and a second memory block 320. The first memory block 310 is grouped with memory devices having memory cells of the same size (e.g., size A), that is, 310*a*, 310*b*, 310*c*, and 310*d*, and the second memory block 320 is grouped with memory devices having memory cells of the same size (e.g., size B), that is, 320*a* and 320*b*. In such configuration, since pattern lengths and the number of addresses of memory cells are the same in respective memory blocks 310, 320, each memory block 310, 320 may include a single BIST circuit, a single serial interface circuit for communicating with a repair information control block, and N number of BIRA circuits corresponding to the number of memory cells.

In some aspects, if memory cells of the same size are grouped to form a memory block, a test time of the detecting a fault cell may be reduced.

Figure 9:
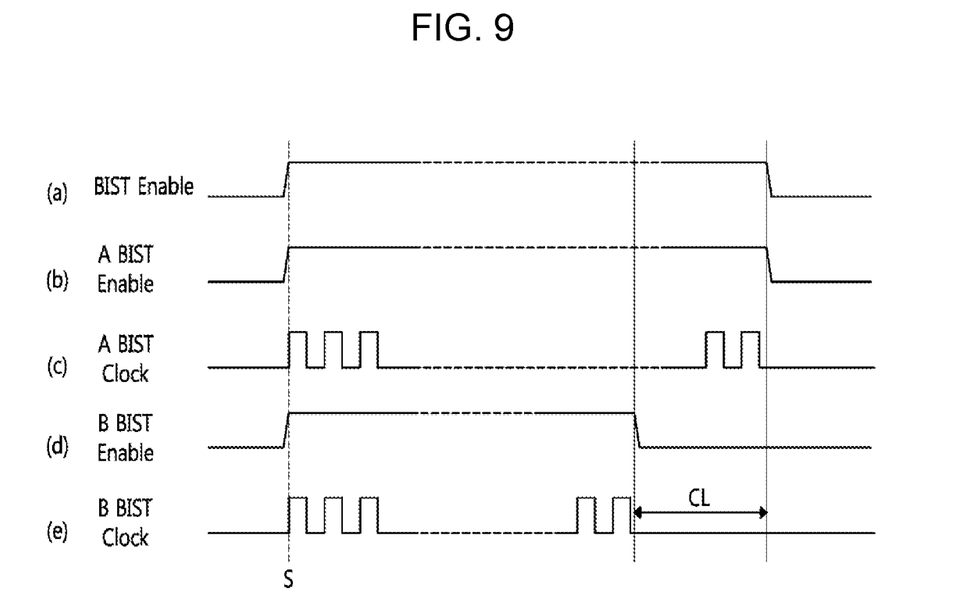
FIG. 9 illustrates a timing diagram for a Built-in Self test (BIST) operation of memory blocks having memory cells grouped by size according to various aspects of the present disclosure.

FIG. 9 illustrates a timing diagram for a BIST operation of memory blocks having memory cells grouped by size according to various aspects of the present disclosure.

In FIG. 8B, it is assumed that the size of a memory cell of a first memory block 310 is greater than the size of a memory cell of a second memory block 320 (e.g., size A>size B).

In this case, referring to FIG. 9, label (a) illustrates when a BIST Enable signal changes from low level to high level, label (b) illustrates that the first BIST circuit of the first memory block 310 generates a high level of A BIST Enable signal, label (d) illustrates that a second BIST circuit of the second memory block 320 also generates a high-level of B BIST Enable signal (S).

While the A BIST Enable signal and the B BIST Enable signal maintain a high level, the first BIST circuit generates A BIST Clock signal at label (c) and, at label (e), and the second BIST circuit generates B BIST Clock signal at label (e), respectively. At this time, due to the difference in memory size, the first BIST circuit in the first memory block 310 has a larger memory cell operates for a longer time, as illustrated in label (c). Therefore, as illustrated in label (e) of FIG. 9, there is a period CL in which the second BIST circuit of the second memory block 320 does not operate.

According to one or more examples of the present disclosure, during the period CL, the memory control unit 5 may prevent the clock signal and pattern signal of the second BIST circuit from being generated, thereby reducing current consumption. If there are memory cells of different sizes for each memory block, a BIST circuit is required for each size of the memory cell, and the BIST circuit must be activated continuously, resulting in continuous current loss.

According to the present disclosure, the number of routings required for repair information transmission may be reduced by allowing data to be transmitted between a repair information control block and a memory block in a serial interface. The serial interface may prevent a congestion issue from occurring during the repair process and prevent miscommunication of information, thereby improving the yield and quality of the integrated circuit.

According to the present disclosure, by grouping memory devices including memory cells of the same size for each memory block, the number of circuit elements required for each memory block may be reduced, thereby reducing space of the chip area and also reducing the test time for detecting a fault cell. In addition, it may be possible to reduce the current consumption generated during the test period since all memory blocks are not tested and memory blocks with small-sized memory cells do not need to be tested while other memory blocks with large-sized memory cells are being tested.

As described above, since a memory is repaired using a serial interface according to examples of the present disclosure, the number of routings may be reduced compared to the conventional art, and it may be seen that BIST time may be shortened by grouping memory cells by the same size for each memory block to perform repair.

What is claimed is:

1. A memory repair device comprising:
at least one memory block including at least one memory;
a memory control unit configured to inspect sizes of the at least one memory and group the at least one memory of a same size into a corresponding memory block; and
a repair information control block configured to:
perform a Built-in Self-Test (BIST) for each memory block of the at least one memory block, and
when a fault cell is detected as a result of the BIST, receive and store repair information related to the fault cell in a repair information storage block,
wherein the memory block is configured to repair the fault cell with a redundancy cell according to the repair information when the memory block loads the repair information during operation of the at least one memory.

2. The memory repair device of claim 1, wherein, data is transmitted and received between the repair information control block and the memory block using a serial interface associated with an interface conversion circuit.

3. The memory repair device of claim 2, wherein the interface conversion circuit comprises a first interface conversion circuit and a second interface conversion circuit configured to transmit serial data between the repair information control block and the memory block,
wherein the first interface conversion circuit transmits the serial data based on a clock signal generated by a clock generation unit, and
wherein the second interface conversion circuit transmits the serial data based on the clock signal provided by the clock generation unit of the first interface conversion circuit.

4. The memory repair device of claim 1, wherein the repair information control block comprises:
a BIST control circuit configured to generate a fault cell detection command for BIST of the memory block;
a first interface conversion circuit configured to converts the fault cell detection command into serial data; and
a repair information alignment circuit configured to align the repair information transmitted from the memory block such that the repair information is stored in a predetermined location of the repair information storage block.

5. The memory repair device of claim 1, wherein the memory block comprises:

a second interface conversion circuit configured to generate a BIST start flag when serial data is converted into a fault cell detection command;

a BIST circuit configured to detect whether the fault cell according to the fault cell detection command; and a Built-in Redundancy Analysis (BIRA) circuit configured to detect and transmit the repair information related to the fault cell to the repair information control block based on detecting the fault cell.

6. The memory repair device of claim 5, wherein the BIST circuit includes:

a pattern generation circuit configured to generate pattern information suitable for a size of the memory and storing data and addresses in the memory; and a pattern confirmation circuit configured to detect the fault cell based on the pattern information of the data provided by the memory.

7. The memory repair device of claim 6, wherein the pattern generation circuit is configured to generate the pattern information if the BIST start flag is received from the second interface conversion circuit.

8. The memory repair device of claim 5, wherein the BIRA circuit comprises:

a fault cell address detection circuit configured to detect a fault cell address; and a fault cell address conversion circuit configured to receive a user address and remap the fault cell address to a redundancy cell address to be transmitted to the memory when a repair process is performed by the repair information control block.

9. The memory repair device of claim 1, wherein the repair information comprises address information of the fault cell and index information indicating the memory block where the fault cell is located.

10. The memory repair device of claim 1, wherein the repair information storage block is located inside the memory block or outside the memory block.

11. A memory repair device comprising:

a repair information control block;

memory blocks including memory cells connected to the repair information control block through a serial interface; and a memory control unit configured to inspect sizes of the memory cells and group the memory cells of a same size into a corresponding memory block, wherein the repair information control block is configured to load and transmit previously stored repair information to the memory blocks, and wherein the memory block repairs a memory by remapping a fault cell address to a redundancy cell address based on the repair information.

12. The memory repair device of claim 11, wherein the repair information control block only accesses the memory block that is determined to include at least one fault cell to repair the memory.

13. The memory repair device of claim 11, wherein the memory block is configured to perform a repair process if the repair information loaded by the repair information control block is transmitted at a time of operation of the memory.

14. The memory repair device of claim 11, wherein the repair information control block loads the repair information from a repair information storage block.

15. The memory repair device of claim 14, wherein the repair information storage block is located inside the memory block or outside the memory block.

16. A memory repair device comprising:

memory blocks; and a memory control unit configured to group the memory blocks having memory cells of the same size into a corresponding memory block, wherein each memory block of the memory blocks comprises:

memory devices having memory cells of a same size;

a single Built-in Self-Test (BIST) circuit configured to detect a fault cell of the memory devices;

BIRA circuits, a BIRA-Buit-in Redundancy Analysis (BIRA) circuit provided in each of the memory devices; and a serial interface circuit configured to communicate with the memory control unit.

17. The memory repair device of claim 16, wherein the memory control unit is configured to:

perform a Built-in Self-Test on the memory devices of various sizes provided in each of the memory blocks at one time; and repair a memory device including the fault cell.

18. The memory repair device of claim 16, wherein the memory control unit generates pattern information and address corresponding to a size of a memory cell.

19. The memory repair device of claim 16, wherein the memory control unit is configured to, during a period in which a BIST function of a memory block with memory cells of a first size is performed, turn off a BIST function of a memory block with memory cells of a second size so that a clock signal is not generated, wherein the first size is greater than the second size.

* * * * *